United States Patent
Nelson

(10) Patent No.: US 12,213,243 B2
(45) Date of Patent: Jan. 28, 2025

(54) TRANSMISSION LINE CAPACITOR AND CIRCUIT BOARD INCLUDING THE SAME EMBEDDED WITHIN

(71) Applicant: KYOCRA AVX Components Corporation, Fountain Inn, SC (US)

(72) Inventor: Cory Nelson, Simpsonville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 30 days.

(21) Appl. No.: 17/718,368

(22) Filed: Apr. 12, 2022

(65) Prior Publication Data

US 2022/0346222 A1     Oct. 27, 2022

Related U.S. Application Data

(60) Provisional application No. 63/221,523, filed on Jul. 14, 2021, provisional application No. 63/180,127, filed on Apr. 27, 2021.

(51) Int. Cl.
*H05K 1/02* (2006.01)
*H05K 3/34* (2006.01)

(52) U.S. Cl.
CPC ........... *H05K 1/0243* (2013.01); *H05K 1/024* (2013.01); *H05K 3/3405* (2013.01)

(58) Field of Classification Search
CPC ...... H05K 1/0243; H05K 1/024; H05K 1/023; H05K 1/0231; H05K 1/0234; H05K 3/3405
See application file for complete search history.

(56) References Cited

U.S. PATENT DOCUMENTS

| | | | |
|---|---|---|---|
| 5,731,747 A * | 3/1998 | Van De Walle | H01L 27/01 361/306.3 |
| 7,263,764 B2 | 9/2007 | Heistand, II et al. | |
| 8,094,429 B2 | 1/2012 | Hsu et al. | |
| 9,831,039 B2 | 11/2017 | Namikawa et al. | |
| 9,866,193 B2 | 1/2018 | Korony | |
| 10,033,346 B2 | 7/2018 | Korony | |
| 2003/0071300 A1* | 4/2003 | Yashima | H01L 28/55 257/E21.009 |
| 2004/0118600 A1* | 6/2004 | Lee | H05K 1/162 174/260 |
| 2018/0351527 A1* | 12/2018 | Korony | H03H 1/02 |

OTHER PUBLICATIONS

International Search Report and Written Opinion for PCT/US2022/024340 dated Aug. 1, 2022, 11 pages.

* cited by examiner

*Primary Examiner* — Hoa C Nguyen
(74) *Attorney, Agent, or Firm* — Dority & Manning, P.A.

(57) ABSTRACT

A surface mount transmission line capacitor can have excellent high frequency performance characteristics. The surface mount transmission line capacitor can include a monolithic substrate having a surface, a first electrode formed over the surface, a second electrode arranged over the first electrode, a dielectric layer arranged between the first electrode and second electrode, a first terminal layer exposed along the surface of the substrate and electrically connected with the first electrode, and a second terminal layer exposed along the surface of the substrate and electrically connected with the second electrode. The first terminal layer and the second terminal layer can be contained within a perimeter of the surface of the monolithic substrate.

32 Claims, 9 Drawing Sheets

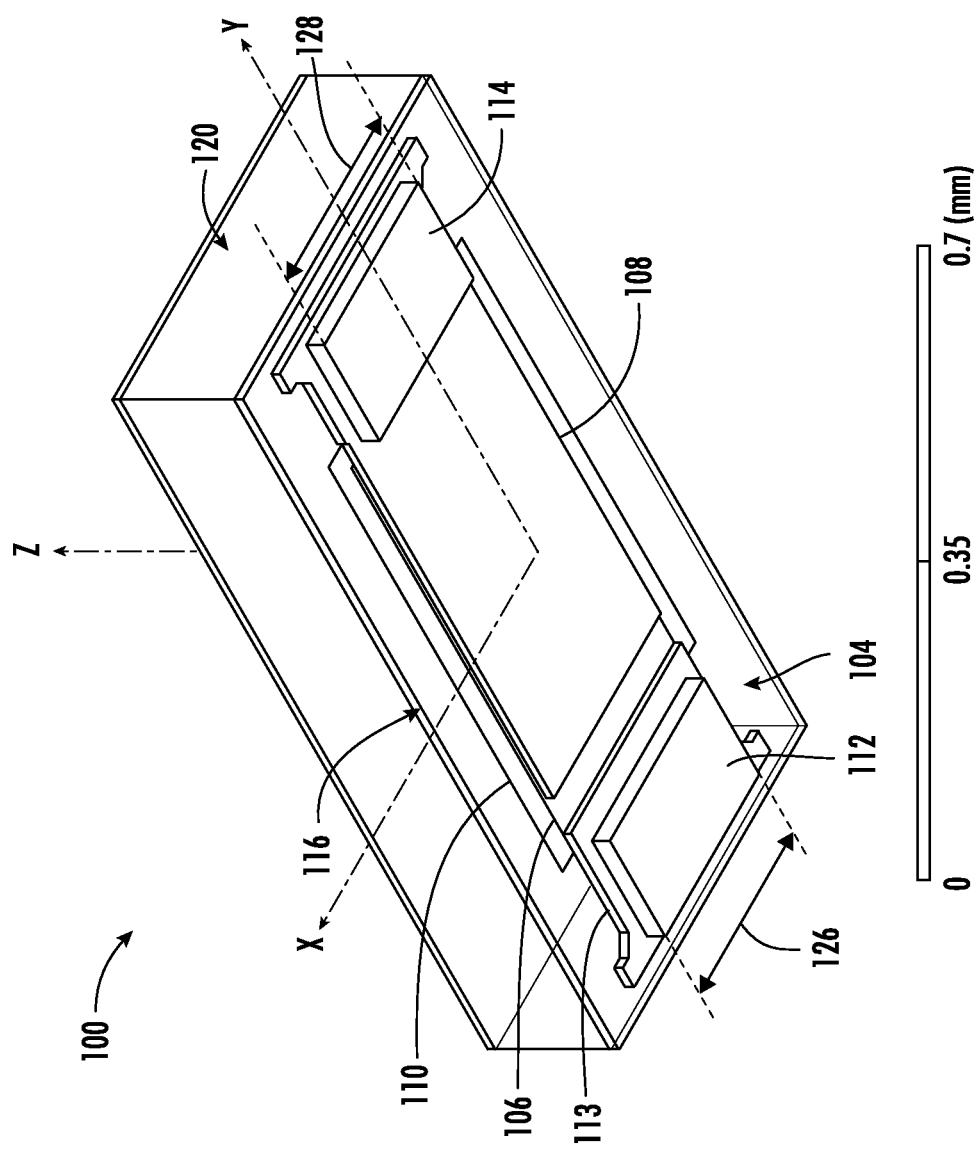

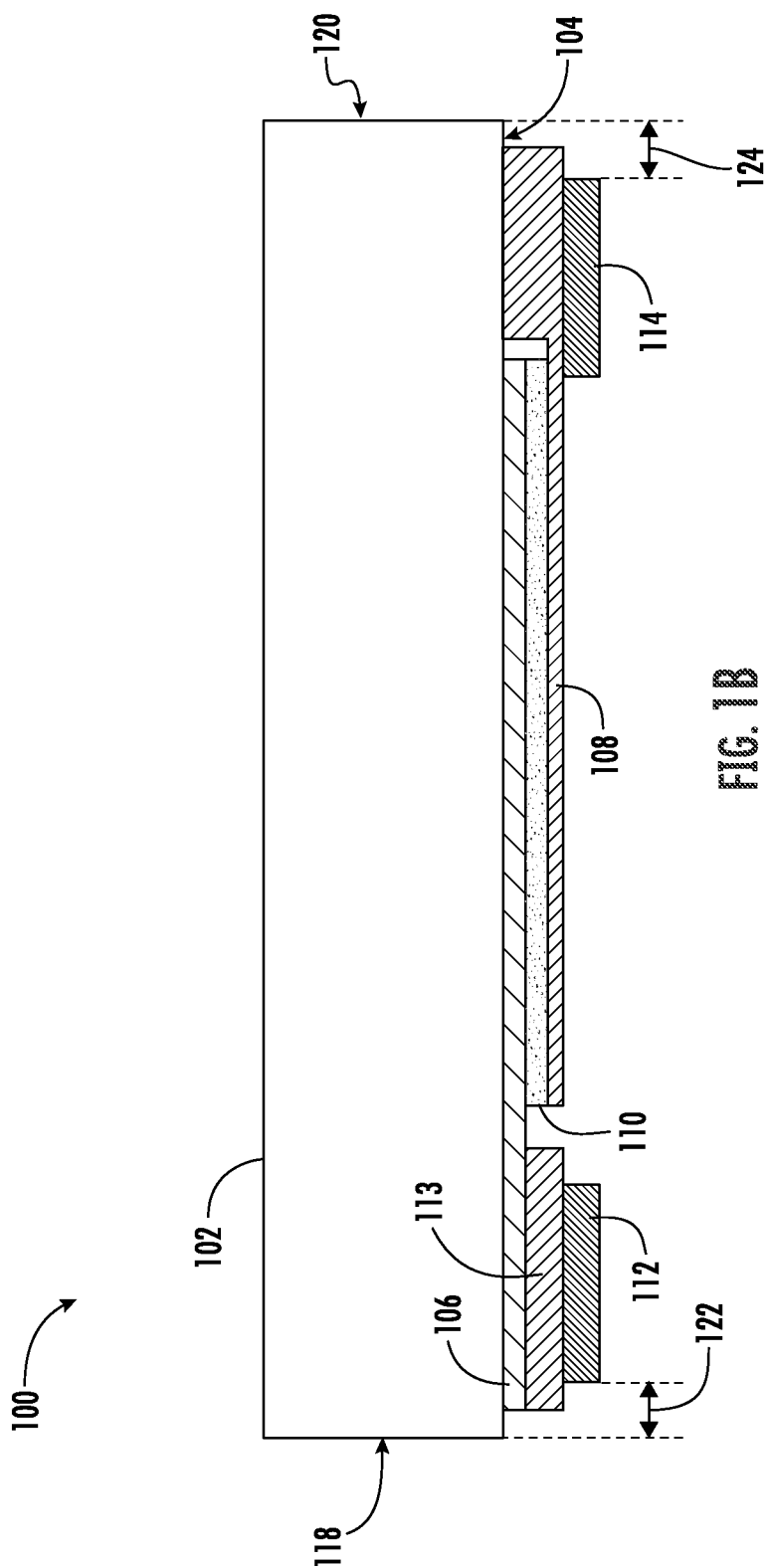

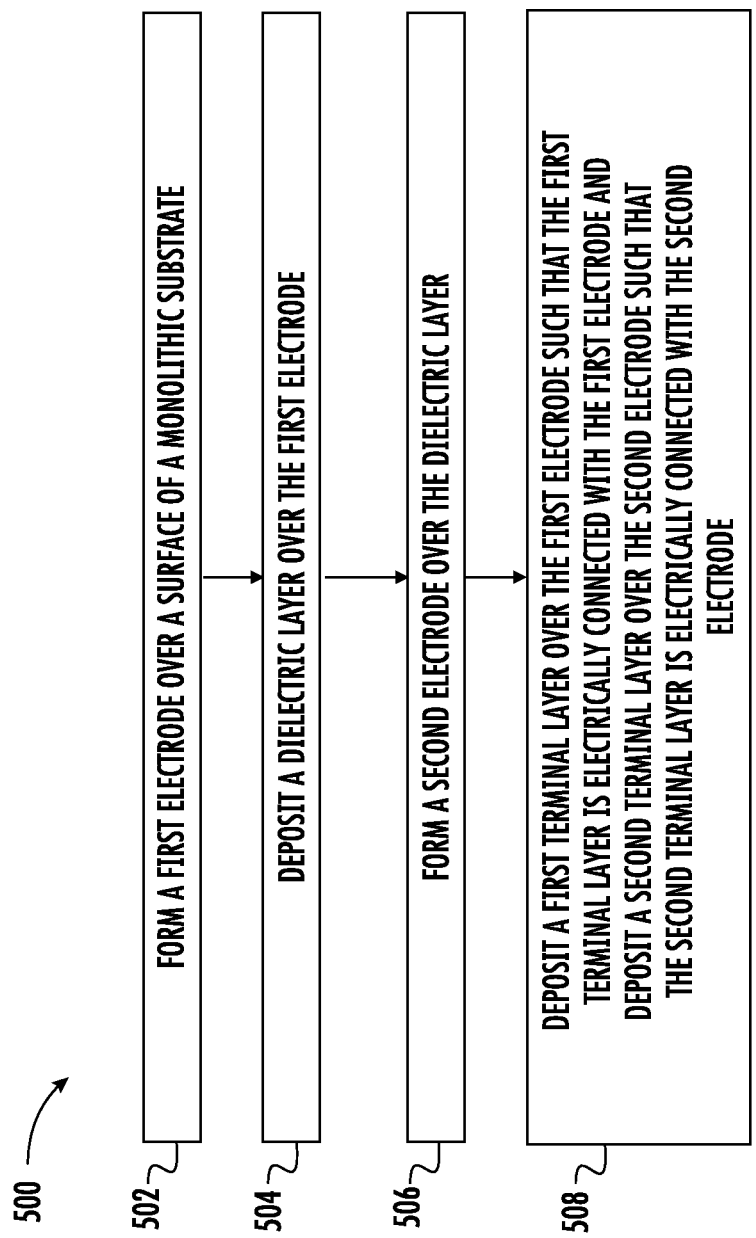

TRANSMISSION LINE CAPACITOR AND CIRCUIT BOARD INCLUDING THE SAME EMBEDDED WITHIN

CROSS REFERENCE TO RELATED APPLICATIONS

The present application claims filing benefit of U.S. Provisional Patent Application Ser. No. 63/180,127 having a filing date of Apr. 27, 2021, and U.S. Provisional Patent Application Ser. No. 63/221,523 having a filing date of Jul. 14, 2021, both of which are incorporated herein by reference in their entirety.

FIELD OF THE SUBJECT MATTER

The presently disclosed subject matter relates to wire-bond transmission line circuits. In particular, the presently disclosed subject matter relates to improvements in such wire-bond devices that provide for fixed components that exhibit tailored variations in frequency response depending on the applied frequencies over the component's useful frequency range.

BACKGROUND OF THE SUBJECT MATTER

Transmission line capacitor circuits may be used in various forms including for DC blocking when placed in series with a transmission line, for RF and source bypassing when in shunt with a transmission line or RF source, and for impedance matching among other applications. Such devices operate by passively adjusting the impedance characteristic of the signal pathway and have applicability in a broad range of applications including optical transceiver modules, broadband receivers, Transmit Optical Sub-Assemblies (TOSA), Receive Optical Sub-Assemblies (ROSA), and various other high frequency devices.

Known wire-bond transmission line capacitive devices have been developed that respond to many of such uses but have not provided a device that meets current desirable operational requirements such as the ability to tailor responses over the usable frequency range of the device. It would be advantageous, therefore, if a device could be developed that could be tailored to provide differing responses from the device over the device's useful frequency range.

SUMMARY OF THE SUBJECT MATTER

In view of the recognized features encountered in the prior art and addressed by the presently disclosed subject matter, improved apparatuses and methodologies have been developed that provide for tailoring differing responses over the useful operating frequency of the device.

In accordance with one aspect of an exemplary embodiment of the presently disclosed subject matter, a surface mount transmission line capacitor can include a monolithic substrate having a surface, a first electrode formed over the surface, a second electrode arranged over the first electrode, a dielectric layer arranged between the first electrode and second electrode, a first terminal layer exposed along the surface of the substrate and electrically connected with the first electrode, and a second terminal layer exposed along the surface of the substrate and electrically connected with the second electrode. The first terminal layer and the second terminal layer can be contained within a perimeter of the surface of the monolithic substrate.

In accordance with another aspect of presently disclosed subject matter, a surface mount transmission line capacitor can include a monolithic substrate having a surface, a first electrode formed over the surface, a second electrode arranged over the first electrode, a dielectric layer arranged between the first electrode and second electrode, a first terminal layer exposed along the surface of the substrate and electrically connected with the first electrode, and a second terminal layer exposed along the surface of the substrate and electrically connected with the second electrode. The first terminal layer and second terminal layer are configured for connection with a mounting surface for surface mounting the surface mount transmission line capacitor on the mounting surface. The surface mount transmission line capacitor can exhibit an insertion loss that is greater than −1.0 dB for frequencies ranging from about 20 GHz to about 60 GHz.

In accordance with another aspect of presently disclosed subject matter, a transmission line capacitor assembly can include a mounting surface and a circuit component mounted to the mounting surface. The circuit component can include a monolithic substrate having a surface and a capacitor formed over the surface of the substrate. The capacitor can include a first electrode, a second electrode, and a dielectric layer arranged between the second electrode and second electrode. The capacitor can include a first terminal layer exposed along the surface of the substrate and coupled to the mounting surface. The capacitor can include a second terminal layer exposed along the surface of the substrate and coupled to the mounting surface.

In accordance with another aspect of presently disclosed subject matter, a circuit board assembly can include a circuit board substrate, a ground plane embedded in the circuit board substrate, and a transmission line capacitor at least partially embedded within the circuit board substrate. The transmission line capacitor can include a monolithic substrate having a top surface and a bottom surface opposite the top surface, a first thin-film electrode formed over the top surface, a second electrode arranged over the first electrode, a dielectric layer arranged between the first electrode and second electrode, a first terminal layer exposed along the top surface of the substrate and electrically connected with the first electrode, a second terminal layer exposed along the top surface of the substrate and electrically connected with the second electrode, and a conductive layer formed over the bottom surface of the monolithic substrate of the transmission line capacitor. The conductive layer electrically can be connected with the ground plane.

In accordance with another aspect of presently disclosed subject matter, a method of manufacturing a transmission line capacitor comprising. The method can include forming a first electrode over a surface of a monolithic substrate; depositing a dielectric layer over the first electrode; forming a second electrode over the dielectric layer; depositing a first terminal layer over the first electrode such that the first terminal layer is electrically connected with the first electrode and depositing a second terminal layer over the second electrode such that the second terminal layer is electrically connected with the second electrode. The first terminal layer and the second terminal layer can be contained within a perimeter of the surface of the monolithic substrate.

Additional embodiments of the presently disclosed subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

Repeat use of reference characters throughout the present specification and appended drawings is intended to represent same or analogous features or elements.

FIG. 1A is a perspective view of a transmission line capacitor according to aspects of the present disclosure;

FIG. 1B is a side elevation view of the transmission line capacitor of FIG. 2A;

FIG. 5 is a flowchart of a method for forming a transmission line capacitor according to aspects of the present disclosure.

DETAILED DESCRIPTION OF THE SUBJECT MATTER

Figure 1C:
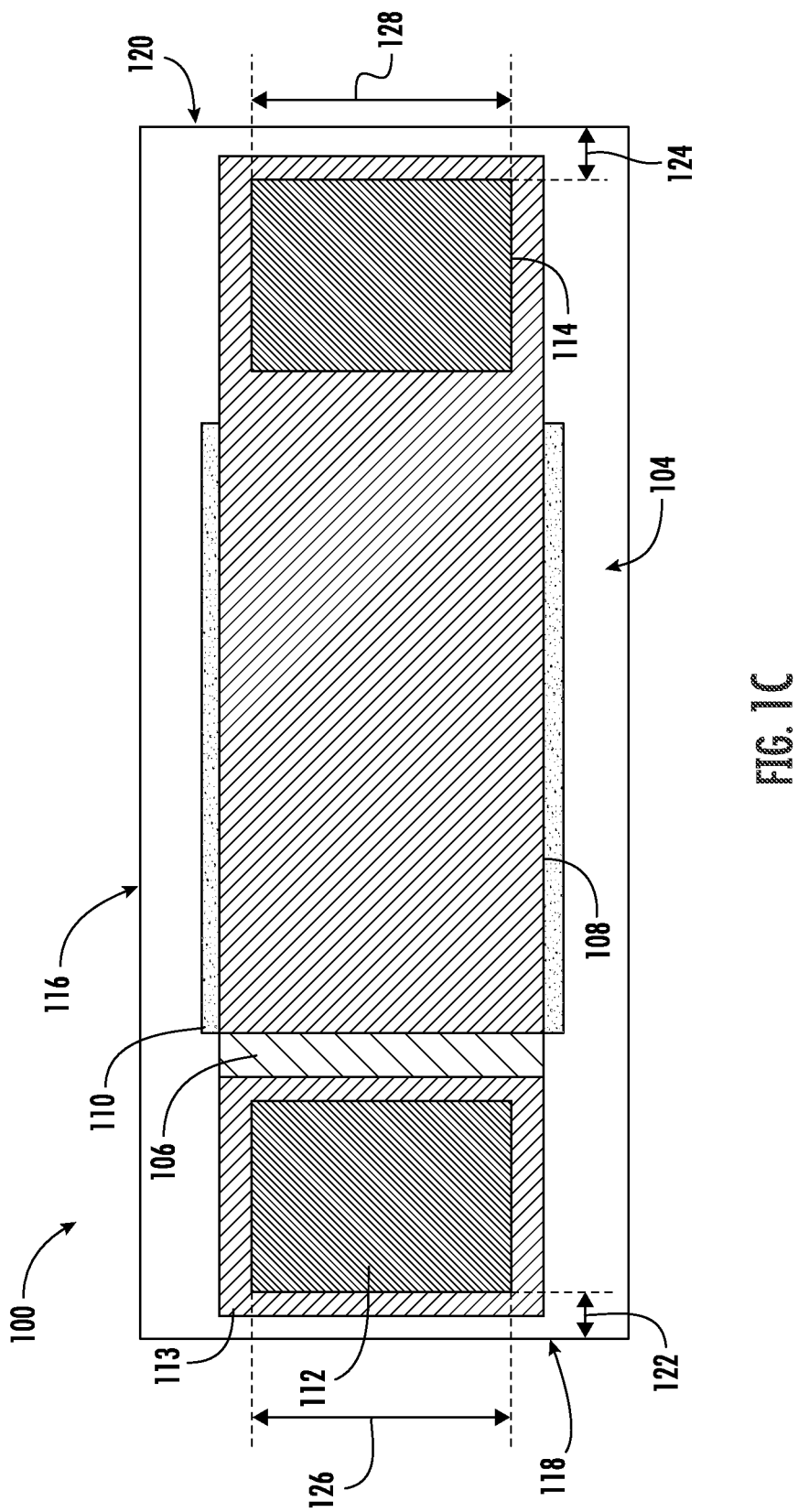
FIG. 1C is a view of the mounting surface of the transmission line capacitor of FIGS. 2A and 2B.

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to improvements to transmission line capacitors. The transmission line capacitor can be configured for grid array type mounting (e.g., land grid array, ball grid array, or the like), for example as a flip chip. Mounting of the transmission line capacitor can be facilitated without electrical connections that cause high frequency perturbations and adversely affect high frequency performance. One example of such electrical connections includes wirebond connections.

The surface mount transmission line capacitor can exhibit excelled high frequency performance. For example, the surface mount transmission line capacitor can exhibit an insertion loss that is greater than about −1.0 dB for frequencies ranging from about 20 GHz to about 60 GHz, in some embodiments greater than about −0.75 dB, in some embodiments greater than about −0.50 dB, and in some embodiments greater than about −0.30 dB.

As another example, the surface mount transmission line capacitor exhibits can exhibit an insertion loss that is greater than about −0.25 dB for frequencies ranging from about 20 GHz to about 48 GHz, in some embodiments from about 20 GHz to about 50 GHz, in some embodiments from about 20 GHz to about 55 GHz, in some embodiments from about 20 GHz to about 60 GHz.

The surface mount transmission line capacitor (e.g., the first terminal layer and the second terminal layer) can be configured for grid array type mounting of the transmission line capacitor, such as ball grid array type mounting or land grid array type mounting. For example, the first terminal layer and the second terminal layer can be exposed along the surface and contained within a perimeter of the surface of the monolithic substrate. As another example, the substrate can have a pair of end surfaces that are perpendicular to the surface of the monolithic substrate. The pair of end surfaces can be free of terminations, including the first terminal layer and the second terminal layer. As a further example, the first terminal layer, the second terminal layer, or both can be spaced apart from the pair of opposite end edges of the surface of the monolithic substrate. The first terminal layer and the second terminal layer can be spaced apart from the opposite end edges by respective distances. The distances can be 10 microns or greater, in some embodiments 12 microns or greater, in some embodiments 15 microns or greater, in some embodiments 20 microns.

The first terminal layer and/or second terminal layer can be configured to be connected with respective conductive traces of a mounting surface that form a transmission line. For example, the first terminal layer can have a width that is matched to a width of a transmission line to which the first terminal layer is mounted. The second terminal layer can have a width that is matched to a width of a transmission line to which the second terminal layer is mounted. For example, a ratio of the width of the conductive trace to the width of the first terminal layer can range from about 0.9 to about 1.1, in some embodiments from about 0.92 to about 1.08, in some embodiments from about 0.95 to about 1.05, and in some embodiments from 0.98 to about 1.02.

The surface mount transmission line capacitor can employ a variety of materials within the scope of the present disclosure. For example, the substrate can include quartz, alumina, or mixtures thereof. In other embodiments, the substrate can include silicon.

The dielectric layer can include silicon oxynitride (SiON), barium titanate (BaTiO3), or mixtures thereof. However, any suitable material can be employed as the dielectric layer.

The electrodes can include a variety of conductive materials, such as aluminum, copper, nickel, tin, or combinations thereof. In some embodiments, one of the electrodes (e.g., an electrode closest to and/or adjacent the substrate) can include aluminum. The other of the electrodes can be or include copper.

The terminal layers can include a variety of conductive materials, such as aluminum, copper, nickel, tin, gold, or combinations thereof. However, any suitable electrically conductive material can be employed as the terminal layer.

In some embodiments, a thin-film resistive layer can be arranged between the electrode layers such that the thin-film resistive layer such that the thin-film resistive layer is connected in series with the dielectric layer between the first electrode and second electrode.

The thin-film resistive layer can include tantalum nitride (TaN). It should be appreciated, however, by those of ordinary skill in the art that other resistive materials may be used in addition to or in place of TaN. Other suitable materials include, but are not limited to, nickel-chromium alloys (NiCr) and ruthenium oxide ($RuO_2$). Such thin-film resistors may be trimmed using laser techniques well known in the art to provide precision resistor values for use with the presently disclosed subject matter. Likewise, it should be appreciated that materials other than SiON may be used for the dielectric material for the capacitor including, but not limited to, barium titanate.

In some embodiments, one or more protective layers can be formed over the surface of the substrate. The terminal layers can be exposed through the protective layers for electrical connection when surface mounting the capacitor. Examples materials for the protective layer include benzocyclobutene (BCB), polyimide, silicon oxynitride, Al2O3, SiO2, Si3N4, epoxy, glass, or another suitable material.

Various thin-film techniques can be used to form thin-film layers, such as the dielectric layer, the electrodes, terminal layers, or the like. Examples of such techniques that may be employed include chemical deposition (e.g., chemical vapor deposition), physical deposition (e.g., sputtering), or any other suitable deposition technique for forming thin-film elements. Additional examples include any suitable patterning technique (e.g., photolithography), etching, and any other suitable subtractive technique for forming thin-film elements.

The thin-film layers can have a range of thicknesses. For example, some or all of the thin-film layers (e.g., the dielectric layer, the electrodes, terminal layers) can have thicknesses that can range from about 0.0375 micrometers (microns) to about 40 microns, in some embodiments from about 0.1 microns to about 30 microns, in some embodiments from about 0.2 microns to about 20 microns in some embodiments from about 0.4 microns to about 10 microns.

FIG. 1A is a perspective view of a transmission line capacitor 100 according to aspects of the present disclosure. FIG. 1B is a side elevation view of the transmission line capacitor 100 of FIG. 1A. The capacitor 100 can include a monolithic substrate 102 having a mounting surface 104. FIG. 1C is a view of the mounting surface of the transmission line capacitor 100 of FIGS. 1A and 1B.

The capacitor 100 can include a first electrode 106 formed over the surface 104 and a second electrode 108 arranged over the first electrode 106, and a dielectric layer 110 arranged between the first electrode 106 and the second electrode 108. A first terminal layer 112 can be electrically connected with the first electrode 106. For example, an intermediate layer 113 can directly contact the first electrode 106. The first terminal layer 112 can directly contact the intermediate layer 113. Thus, the intermediate layer 113 can be arranged between the first electrode 106 and the first terminal layer 112. However, an electrical connection may be formed between the first terminal layer 112 and the first electrode 106 using any suitable structure or configuration of layers. The first terminal layer 112 can be exposed along the surface 104 of the substrate 102 for mounting the transmission line capacitor 100 to a mounting surface as described below with reference to the transmission line capacitor assembly 300 of FIG. 3.

A second terminal layer 114 can be electrically connected with the second electrode 108. The second terminal layer 114 can be formed on the second electrode 108. The second terminal layer 114 can be exposed along the surface 104 of the substrate 102 for surface mounting the transmission line capacitor 100.

The first terminal layer 112 and the second terminal layer 114 can be configured for grid array type mounting of the transmission line capacitor 100, such as ball grid array type mounting or land grid array type mounting. For example, the first terminal layer 112 and the second terminal layer 114 can be exposed along the surface 104 and contained within a perimeter 116 of the surface 104 of the monolithic substrate 102. As another example, the substrate 102 can have a pair of end surfaces 118, 120 that are perpendicular to the surface 104 of the monolithic substrate 102. The pair of end surfaces 118, 120 can be free of terminations, including the first terminal layer 112 and the second terminal layer 114. As a further example, the first terminal layer 112, the second terminal layer 114, or both can be spaced apart from the pair of opposite end edges 118, 120 of the surface 104 of the monolithic substrate 102. The first terminal layer 112 and the second terminal layer 114 can be spaced apart from the opposite end edges 118, 120 by respective distances 122, 124. The distances 122, 124 can be 10 microns or greater.

The first terminal layer 112 and/or second terminal layer 114 can be configured to be connected with respective conductive traces of a mounting surface that form a transmission line. For example, the first terminal layer 112 can have a width 126 that is matched to a width of a transmission line to which the first terminal layer 112 is mounted. The second terminal layer 114 can have a width 128 that is matched to a width of a transmission line to which the second terminal layer 114 is mounted.

Figure 2:
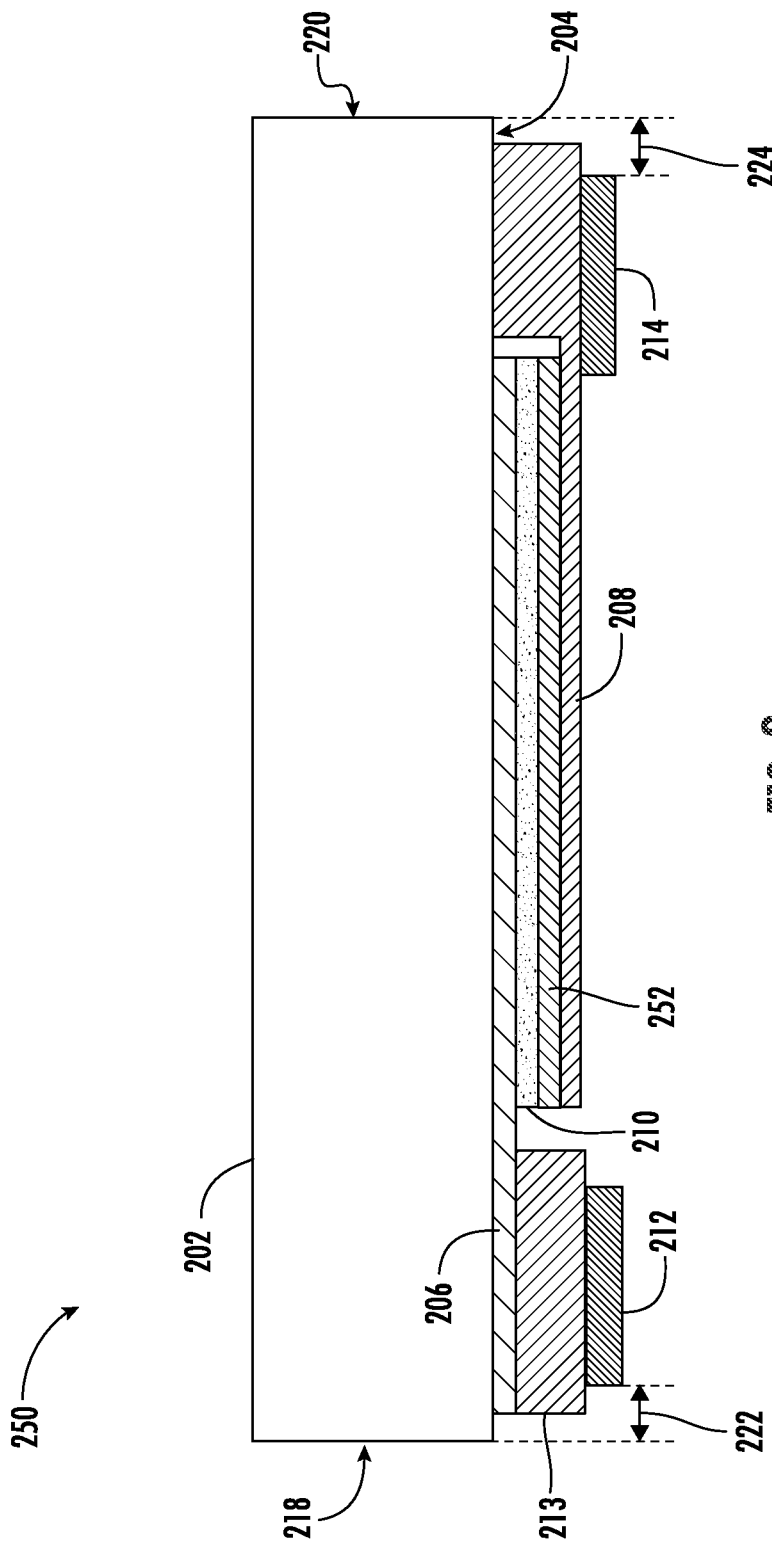
FIG. 2 is a side elevation view of another embodiment of a transmission line capacitor according to aspects of the present disclosure.

FIG. 2 is a side elevation view of another embodiment of a transmission line capacitor 250 according to aspects of the present disclosure. The transmission line capacitor 250 can be generally similar to the transmission line capacitor 100 of FIGS. 1A though 1C. Reference numerals of FIG. 2 are similar to those of FIG. 1. For example, the transmission line capacitor 250 can include a monolithic substrate 202, similar to the monolithic substrate 102 of the transmission line capacitor 100 of FIGS. 1A through 1C.

Referring to FIG. 2, the transmission line capacitor 250 can include a thin-film resistive layer 252. The thin-film resistive layer 252 can be arranged between the first electrode 206 and the second electrode 208 such that the thin-film resistive layer 252 is connected in series with the dielectric layer 210 between the first electrode 206 and second electrode 208. For example, the thin-film resistive layer 252 can directly contact the second electrode 208 and the dielectric layer 210. However, in other embodiments, the thin-film resistive layer 252 can directly contact the first electrode 206. In yet other embodiments, one or more additional layers can be arranged between the thin-film resistive layer 252 and the first electrode 206 and/or second electrode 208.

Figure 3:
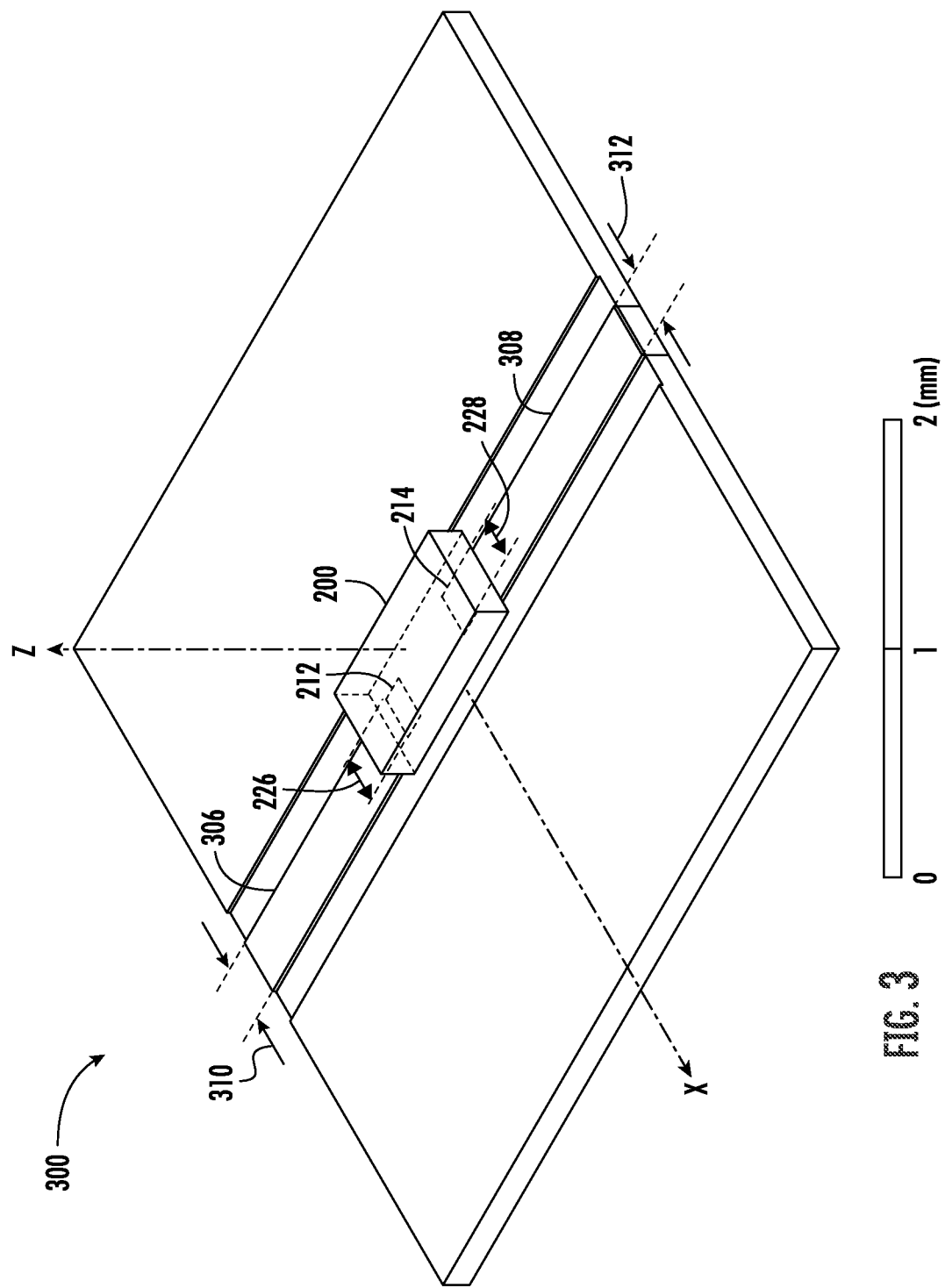
FIG. 3 illustrates a transmission line capacitor assembly according to aspects of the present disclosure.

FIG. 3 illustrates a transmission line capacitor assembly 300 according to aspects of the present disclosure. The transmission line capacitor assembly 302 can include a transmission line capacitor 200 of FIG. 1A through 1C and a mounting surface 304. The transmission line capacitor assembly 300 can be mounted to the mounting surface 304. The first terminal layer 212 can connect with a first conductive trace 306 of the mounting surface 304. The second terminal layer 214 connect with a second conductive trace 308 of the mounting surface 304.

The width 226 of the first terminal layer 212 can be approximately equal to a width 310 of the first transmission line 306. The width 228 of the second terminal layer 214 can be approximately equal to a width 312 of the second transmission line 308. This configuration can provide improved impedance matching.

Figure 4A:
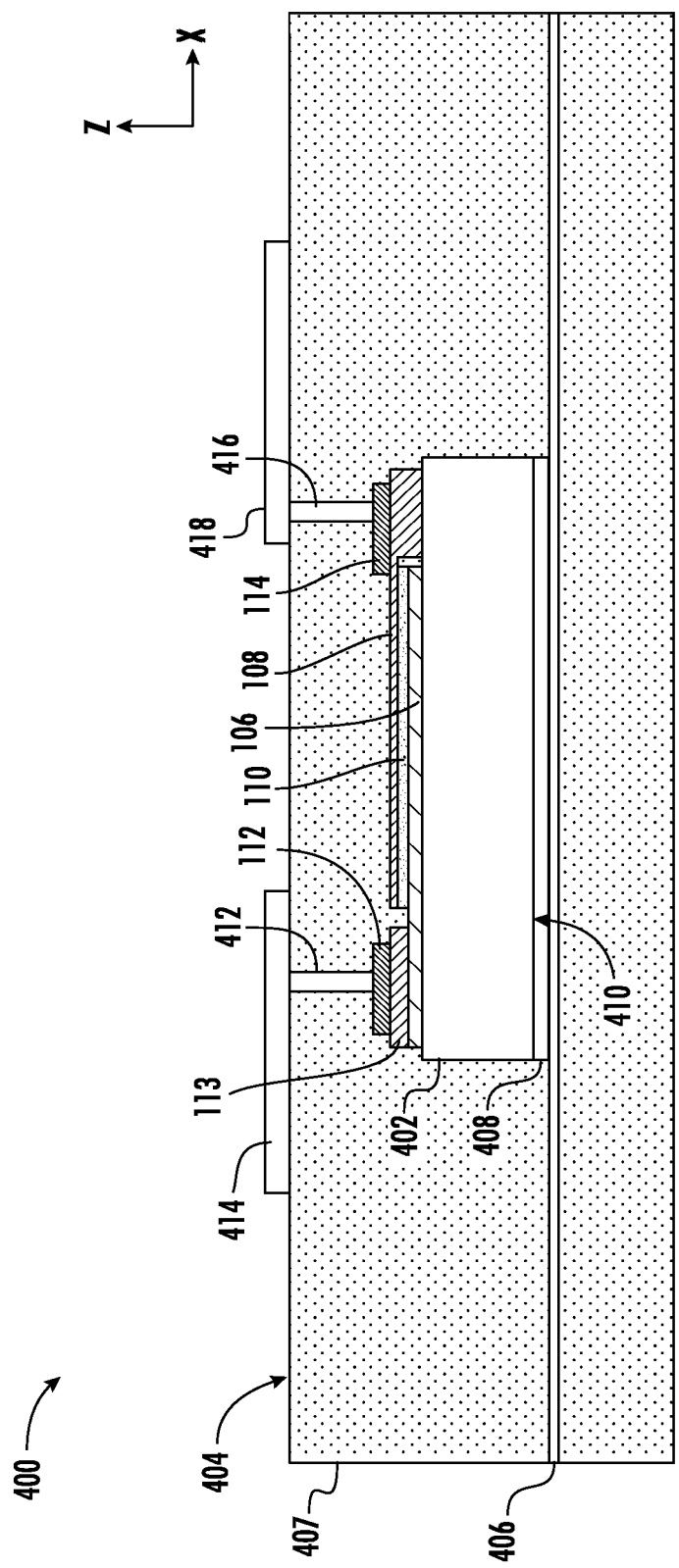
FIG. 4A illustrates a circuit board including an embedded transmission line capacitor directly connected with a ground plane according to aspects of the present disclosure.

FIG. 4A illustrates a circuit board 400 including an embedded transmission line capacitor 402 according to aspects of the present disclosure. The circuit board 400 can include a circuit board substrate 407 including a mounting surface 404. The circuit board 400 can include a ground plane layer 406 embedded within the circuit board substrate 407. The ground plane layer 406 can be at least partially spaced apart from the mounting surface 404. The transmission line capacitor 402 can be at least partially embedded within the circuit board substrate 407 of the circuit board 400. The transmission line capacitor 402 can generally be configured similar to the transmission line capacitor 100 of FIGS. 1A through 2.

The transmission line capacitor 402 can include a conductive layer 408 formed over a bottom surface 410 of the transmission line capacitor 402. The conductive layer 408 of the transmission line capacitor 402 can be connected with the ground plane layer 406. For example, the conductive layer 408 can directly contact the ground plane layer 406. However, one or more intermediate conductive layers can be arranged between the conductive layer 408 and the ground plane layer 406.

A first via 412 can extend from the first terminal layer 112 to a first conductive layer 414 formed over the mounting surface 404 and electrically connecting the first terminal layer 112 with the first conductive layer 414 on the mounting surface 404. A second via 416 can extend from the second terminal layer 114 to a second conductive layer 418 formed over the mounting surface 404 electrically connecting the second terminal layer 114 with the second conductive layer 418. As such, the conductive layers 414, 418 can be used to facilitate electrical connections with the transmission line capacitor 402. However, it should be understood that, in other embodiments, one or more of the terminal layers 112, 114 can be exposed along the mounting surface 404. In such an embodiment, the circuit board 400 can be free of one or more of the vias 412, 416. In some embodiments, the circuit board 400 of FIG. 4A and/or the circuit board of FIG. 4B can include a thin-film resistive layer, for example as described above with reference to the transmission line capacitor 250 of FIG. 2.

Figure 4B:
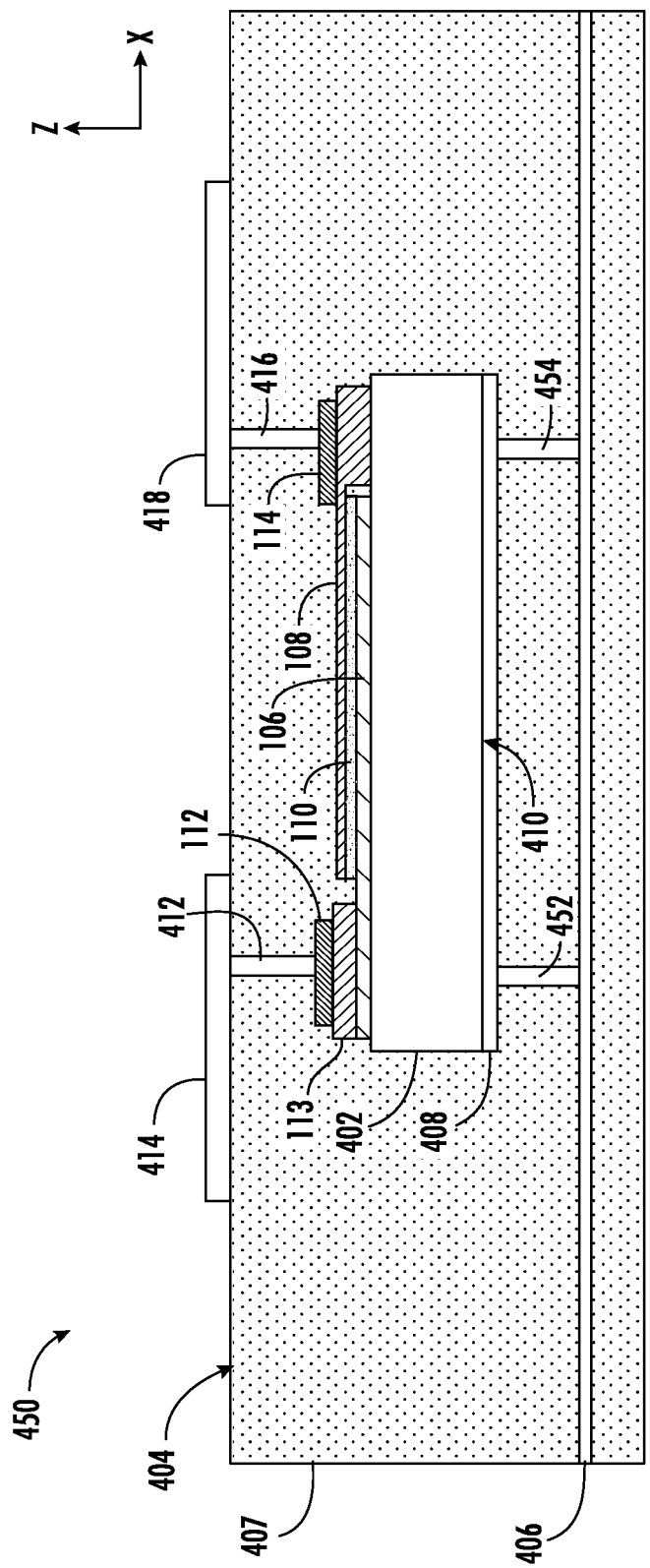
FIG. 4B illustrates a circuit board including an embedded transmission line capacitor electrically connected with a ground plane by one or more vias according to aspects of the present disclosure.

FIG. 4B illustrates another embodiment of a circuit board 450 including an embedded transmission line capacitor 452 according to aspects of the present disclosure. The transmission line capacitor 452 can generally be configured similar to the transmission line capacitor 100 of FIGS. 1A through 1C or the transmission line capacitor 250 of FIG. 2. The circuit board 450 may generally be similar to the circuit board 400 of FIG. 4A. However, the circuit board 450 may additionally include one or more vias 452, 454 connecting the conductive layer 408 of the transmission line capacitor 452 to the ground plane layer 406. FIG. 5 is a flowchart of a method 500 for forming a transmission line capacitor according to aspects of the present disclosure. In general, the method 400 will be described herein with reference to the transmission line capacitor assembly 200 of FIGS. 2A through 2C. However, it should be appreciated that the disclosed method 500 may be implemented with any suitable capacitor. In addition, although FIG. 5 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 500 can include, at (502), forming a first electrode 206 over a surface 204 of a monolithic substrate 202. For example, a layer of aluminum (or other suitable conductive material) can be sputtered over the monolithic substrate 202. However, any suitable conductive material can be deposited to form the first electrode 206.

The method 500 can include, at (504), depositing a dielectric layer 210 over the first electrode 206. For example, a layer of silicon oxynitride (SiON) can be deposited over the first electrode 206. The silicon oxynitride can be etched (e.g., using a suitable lithographic technique) to shape the dielectric layer 210, for example as shown in FIGS. 2A through 2C.

The method 500 can include, at (506), forming a second electrode 208 over the dielectric layer 210. For example, a coper layer can be sputtered and/or plated over the dielectric layer 210.

The method 500 can include, at (508), depositing a first terminal layer 212 over the first electrode 206 such that the first terminal layer 212 is electrically connected with the first electrode 206 and depositing a second terminal layer 214 over the second electrode 208 such that the second terminal layer 214 is electrically connected with the second electrode 208. The first terminal layer 212 and the second terminal layer 214 can be contained within a perimeter 216 of the surface 204 of the monolithic substrate 202. For example, the first terminal layer 212 and second terminal layer 214 can be printed using any suitable technique.

In some embodiments, the above steps can be performed on a large substrate layer. The substrate layer can be diced to form multiple individual surface mount transmission line capacitor 200.

Figure 6:
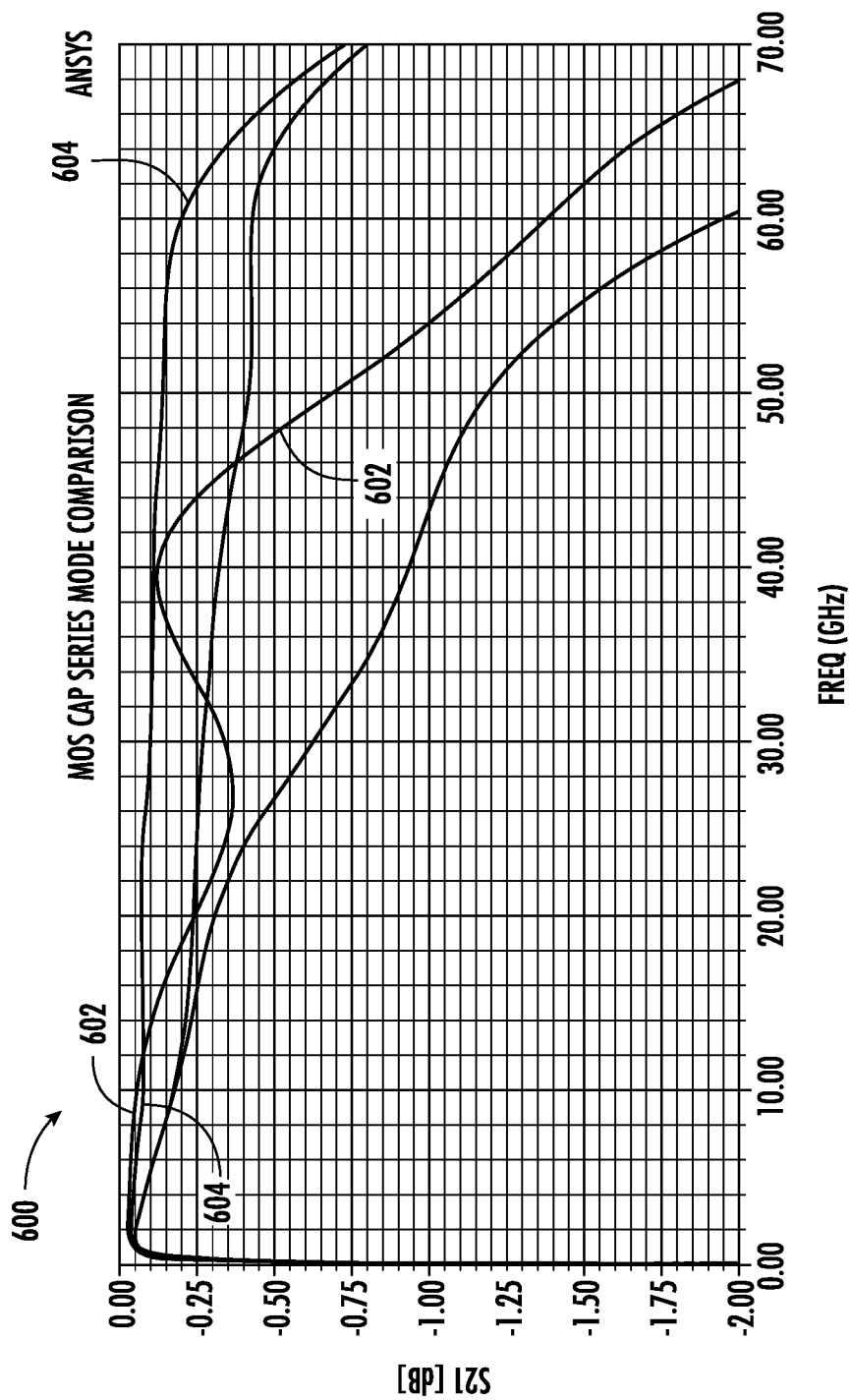
FIG. 6 illustrates an insertion loss curve for a prior art capacitor assembly and an insertion loss curve for the transmission line capacitor of FIGS. 2A through 2C.

FIG. 6 illustrates an insertion loss curve 602 for a prior art capacitor assembly and an insertion loss curve 604 for the transmission line capacitor 200 of FIGS. 2A through 2C. The prior art transmission line capacitor assembly includes a mounting surface and a transmission line capacitor. The prior art capacitor includes a first electrode and a second electrode. The mounting surface includes a first conductive trace and a second conductive trace. A first plurality of wirebonds can connect the first electrode with the first conductive trace of the mounting surface. A second plurality of wirebonds can connect the second electrode with the second conductive trace of the mounting surface.

The surface mount transmission line capacitor 200 exhibits improved performance at high frequencies with respect to the prior art capacitor assembly. As one example, the surface mount transmission line capacitor 200 exhibits an insertion loss that is greater than −1.0 dB for frequencies ranging from about 20 GHz to about 60 GHz. As another example, the surface mount transmission line capacitor 200 exhibits an insertion loss that is greater than −0.25 dB for frequencies ranging from about 20 GHz to about 50 GHz.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A surface mount transmission line capacitor comprising:
   a monolithic substrate having a surface;
   a first thin-film electrode formed over the surface;
   a second electrode arranged over the first electrode;
   a dielectric layer arranged between the first electrode and second electrode;
   a first terminal layer exposed along the surface of the substrate and electrically connected with the first electrode, the first terminal layer having a width in an X-direction and a length in a Y-direction to define a planar surface, the X-direction perpendicular to the Y-direction; and
   a second terminal layer exposed along the surface of the substrate and electrically connected with the second electrode, the second terminal layer having a width in an X-direction and a length in a Y-direction to define a planar surface,
   wherein the first terminal layer and the second terminal layer are contained within a perimeter of the surface of the monolithic substrate, and
   wherein the planar surface of the first terminal layer and the planar surface of the second terminal layer are aligned in a Z-direction, the Z-direction perpendicular to each of the X-direction and the Y-direction.

2. The surface mount transmission line capacitor of claim 1, wherein:
   the substrate has a pair of end surfaces that are perpendicular to the surface of the monolithic substrate; and
   the pair of end surfaces is free of terminations.

3. The surface mount transmission line capacitor of claim 1, wherein the surface of the substrate has a pair of opposite end edges, and wherein each of the first terminal layer and the second terminal layer is spaced apart from the pair of opposite end edges of the surface of the monolithic substrate.

4. The surface mount transmission line capacitor of claim 3, where the first terminal layer and second terminal layer are spaced apart from edges by respective distances that are 10 microns or greater.

5. The surface mount transmission line capacitor of claim 1, wherein the surface mount transmission line capacitor exhibits an insertion loss that is greater than −1.0 dB for frequencies ranging from about 20 GHz to about 60 GHz.

6. The surface mount transmission line capacitor of claim 1, wherein the surface mount transmission line capacitor exhibits an insertion loss that is greater than −0.25 dB for frequencies ranging from about 20 GHz to about 50 GHz.

7. The surface mount transmission line capacitor of claim 1, wherein the substrate comprises at least one of quartz or alumina.

8. The surface mount transmission line capacitor of claim 1, wherein the substrate comprises silicon.

9. The surface mount transmission line capacitor of claim 1, wherein a thin-film resistive layer is arranged between the first electrode and the second electrode such that the thin-film resistive layer is connected in series with the capacitor.

10. The surface mount transmission line capacitor of claim 9, wherein the thin-film resistive layer directly contacts at least one of the first electrode or the second electrode.

11. The surface mount transmission line capacitor of claim 10, wherein the thin-film resistive layer comprises at least one of tantalum nitride (TaN), nickel-chromium alloys (NiCr), and ruthenium oxide (RuO2).

12. The surface mount transmission line capacitor of claim 1, wherein the dielectric layer comprises at least one of silicon oxynitride (SiON) or barium titanate (BaTiO3).

13. A surface mount transmission line capacitor comprising:
    a monolithic substrate having a surface;
    a first electrode formed over the surface;
    a second electrode arranged over the first electrode;
    a dielectric layer arranged between the first electrode and second electrode;
    a first terminal layer exposed along the surface of the substrate and electrically connected with the first electrode, the first terminal layer having a width in an X-direction and a length in a Y-direction to define a planar surface, the X-direction perpendicular to the Y-direction; and
    a second terminal layer exposed along the surface of the substrate and electrically connected with the second electrode, the second terminal layer having a width in an X-direction and a length in a Y-direction to define a planar surface,
    wherein the planar surface of the first terminal layer and the planar surface of the second terminal layer are aligned in a Z-direction that is perpendicular to each of the X-direction and the Y-direction such that the first terminal layer and second terminal layer are configured for connection with a mounting surface for surface mounting the surface mount transmission line capacitor on the mounting surface, and
    wherein the surface mount transmission line capacitor exhibits an insertion loss that is greater than −1.0 dB for frequencies ranging from about 20 GHz to about 60 GHz.

14. The surface mount transmission line capacitor of claim 13, wherein:
    the substrate has a pair of end surfaces that are perpendicular to the surface of the monolithic substrate; and
    the pair of end surfaces is free of terminations.

15. The surface mount transmission line capacitor of claim 13, wherein the surface of the substrate has a pair of opposite end edges, and wherein each of the first terminal layer and the second terminal layer is spaced apart from the pair of opposite end edges of the surface of the monolithic substrate.

16. The surface mount transmission line capacitor of claim 15, where the first terminal layer and second terminal layer are spaced apart from edges by respective distances that are 10 microns or greater.

17. The surface mount transmission line capacitor of claim 13, wherein the surface mount transmission line capacitor exhibits an insertion loss that is greater than −1.0 dB for frequencies ranging from about 20 GHz to about 60 GHz.

18. The surface mount transmission line capacitor of claim 13, wherein the surface mount transmission line capacitor exhibits an insertion loss that is greater than −0.25 dB for frequencies ranging from about 20 GHz to about 48 GHz.

19. The surface mount transmission line capacitor of claim 13, wherein the substrate comprises at least one of quartz or alumina.

20. The surface mount transmission line capacitor of claim 13, wherein the substrate comprises silicon.

21. The surface mount transmission line capacitor of claim 13, wherein a thin-film resistive layer is arranged between the first electrode and the second electrode such that the thin-film resistive layer is connected in series with the capacitor.

22. The surface mount transmission line capacitor of claim 21, wherein the thin-film resistive layer directly contacts at least one of the first electrode or the second electrode.

23. The surface mount transmission line capacitor of claim 22, wherein the thin-film resistive layer comprises at least one of tantalum nitride (TaN), nickel-chromium alloys (NiCr), and ruthenium oxide (RuO2).

24. The surface mount transmission line capacitor of claim 13, wherein the dielectric layer comprises at least one of silicon oxynitride (SiON) or barium titanate (BaTiO3).

25. A transmission line capacitor assembly comprising:
a mounting surface; and
a circuit component mounted to the mounting surface, the circuit component comprising:
a monolithic substrate having a surface;
a capacitor formed over the surface of the substrate, the capacitor comprising:
a first electrode, a second electrode, and a dielectric layer arranged between the second electrode and second electrode;
a first terminal layer exposed along the surface of the substrate and coupled to the mounting surface, the first terminal layer having a width in an X-direction and a length in a Y-direction to define a planar surface, the X-direction perpendicular to the Y-direction; and
a second terminal layer exposed along the surface of the substrate and coupled to the mounting surface, the second terminal layer having a width in an X-direction and a length in a Y-direction to define a planar surface,
wherein the first terminal layer and the second terminal layer are contained within a perimeter of the surface of the monolithic substrate, and
wherein the planar surface of the first terminal layer and the planar surface of the second terminal layer are aligned in a Z-direction, the Z-direction perpendicular to each of the X-direction and the Y-direction.

26. The transmission line capacitor assembly of claim 25, wherein the transmission line capacitor assembly is free of wirebond connections.

27. The transmission line capacitor assembly of claim 25, wherein the mounting surface comprises a conductive trace having a width, the conductive trace connected with the first terminal layer, wherein a ratio of the width of the conductive trace to the width of the first terminal layer ranges from about 0.9 to about 1.1.

28. A circuit board assembly comprising:
a circuit board substrate;
a ground plane embedded in the circuit board substrate;
a transmission line capacitor at least partially embedded within the circuit board substrate, the transmission line capacitor comprising:
a monolithic substrate having a top surface and a bottom surface opposite the top surface;
a first thin-film electrode formed over the top surface;
a second electrode arranged over the first electrode;
a dielectric layer arranged between the first electrode and second electrode;
a first terminal layer exposed along the top surface of the substrate and electrically connected with the first electrode, the first terminal layer having a width in an X-direction and a length in a Y-direction to define a planar surface, the X-direction perpendicular to the Y-direction;
a second terminal layer exposed along the top surface of the substrate and electrically connected with the second electrode, the second terminal layer having a width in an X-direction and a length in a Y-direction to define a planar surface; and
a conductive layer formed over the bottom surface of the monolithic substrate of the transmission line capacitor, the conductive layer electrically connected with the ground plane,
wherein the planar surface of the first terminal layer and the planar surface of the second terminal layer are aligned in a Z-direction, the Z-direction perpendicular to each of the X-direction and the Y-direction.

29. The circuit board assembly of claim 28, wherein the conductive layer directly contacts the ground plane.

30. The circuit board assembly of claim 28, further comprising at least one via connected with each of the conductive layer and the ground plane.

31. The circuit board assembly of claim 28, wherein the first terminal layer and the second terminal layer are contained within a perimeter of the top surface of the monolithic substrate.

32. A method of manufacturing a transmission line capacitor comprising:
forming a first electrode over a surface of a monolithic substrate;
depositing a dielectric layer over the first electrode;
forming a second electrode over the dielectric layer;
depositing a first terminal layer over the first electrode such that the first terminal layer is electrically connected with the first electrode, the first terminal layer having a width in an X-direction and a length in a Y-direction to define a planar surface, the X-direction perpendicular to the Y-direction; and
depositing a second terminal layer over the second electrode such that the second terminal layer is electrically connected with the second electrode, the second terminal layer having a width in an X-direction and a length in a Y-direction to define a planar surface,
wherein the first terminal layer and the second terminal layer are contained within a perimeter of the surface of the monolithic substrate, and
wherein the planar surface of the first terminal layer and the planar surface of the second terminal layer are aligned in a Z-direction, the Z-direction perpendicular to each of the X-direction and the Y-direction.

* * * * *